(12) United States Patent
Brechbühl et al.

(10) Patent No.: US 6,777,856 B2
(45) Date of Patent: Aug. 17, 2004

(54) CRYSTAL ELEMENT FOR PIEZO SENSORS

(75) Inventors: Stefan Brechbühl, Weinfelden (CH); Roland Sommer, Seuzach (CH)

(73) Assignee: Kistler Holding AG, Winterthur (CH)

( * ) Notice: Subject to any disclaimer, the term of this patent is extended or adjusted under 35 U.S.C. 154(b) by 0 days.

(21) Appl. No.: 10/208,737

(22) Filed: Aug. 1, 2002

(65) Prior Publication Data

US 2003/0085637 A1 May 8, 2003

(30) Foreign Application Priority Data

Aug. 2, 2001 (CH) ................................. 2001 1418/01
Jul. 31, 2002 (CH) ................................. 2002 1345/02

(51) Int. Cl.$^7$ ............................................. H01L 41/08
(52) U.S. Cl. ................................... 310/328; 310/365
(58) Field of Search ............................ 310/323.19, 328, 310/329, 334, 338, 365, 367, 330–332

(56) References Cited

U.S. PATENT DOCUMENTS

| | | | | |
|---|---|---|---|---|
| RE20,213 E | * | 12/1936 | Sawyer ........................ | 310/328 |
| 3,148,289 A | * | 9/1964 | Pijls et al. ................... | 310/328 |
| 3,899,698 A | * | 8/1975 | Kleinschmidt ............... | 310/328 |
| 4,494,409 A | * | 1/1985 | Kondo et al. ................. | 73/651 |
| 4,864,178 A | * | 9/1989 | Bjurling et al. ............. | 310/334 |
| 5,512,990 A | * | 4/1996 | Friel et al. ................... | 355/273 |
| 5,631,764 A | * | 5/1997 | Chae ............................ | 359/224 |
| 5,682,260 A | * | 10/1997 | Jeon ............................ | 359/224 |
| 5,708,521 A | * | 1/1998 | Jeon et al. ................... | 359/224 |
| 5,758,396 A | * | 6/1998 | Jeon et al. ................... | 29/25.35 |
| 5,800,671 A | * | 9/1998 | Rabe ........................... | 156/580.1 |
| 5,998,911 A | * | 12/1999 | Kikuchi et al. ............. | 310/367 |
| 6,098,460 A | * | 8/2000 | Otsuchi et al. ............ | 73/514.34 |
| 6,246,155 B1 | * | 6/2001 | Nishihara et al. .......... | 310/328 |
| 6,323,583 B1 | * | 11/2001 | Gunther et al. ............. | 310/330 |
| 6,382,026 B1 | * | 5/2002 | Tajika et al. .............. | 73/514.34 |
| 6,545,391 B1 | * | 4/2003 | Su et al. ....................... | 310/332 |

* cited by examiner

Primary Examiner—Thomas M. Dougherty
(74) Attorney, Agent, or Firm—Barnes & Thornburg

(57) ABSTRACT

A piezoelectric crystal with transversal effect comprising: at least one plate; and, at least one base at an angle to the at least on plate, the at least one base projecting laterally beyond a thickness of the least one plate on at least one side of the at least one plate. A piezoelectric sensor, for detecting one or more of force, pressure, acceleration, moments and strain signals, comprising at least one of the piezoelectric crystals with transversal effects. A method for producing the piezoelectric crystals with transversal effect is disclosed.

10 Claims, 2 Drawing Sheets

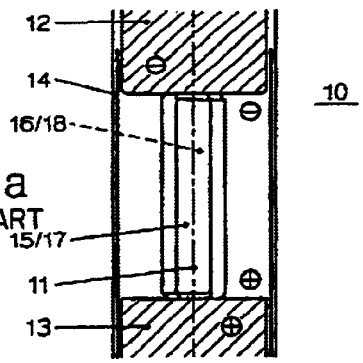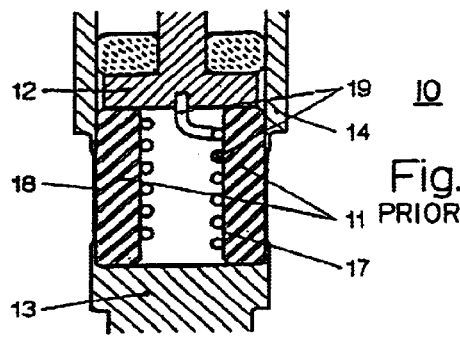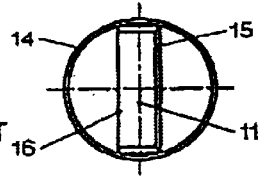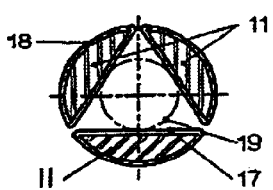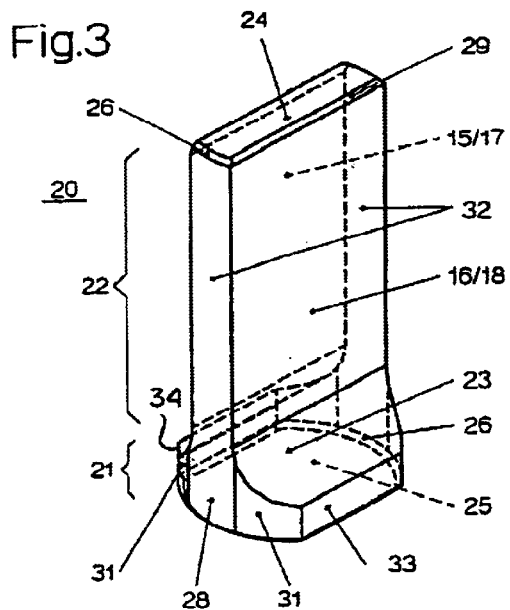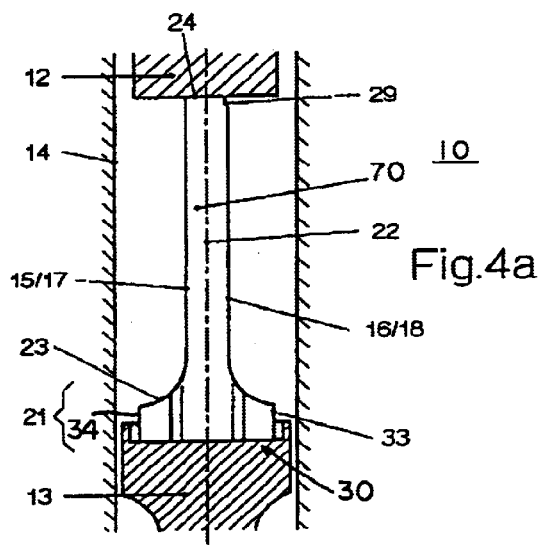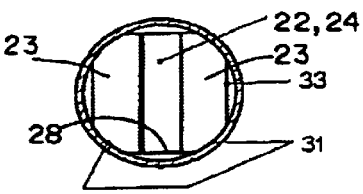

CRYSTAL ELEMENT FOR PIEZO SENSORS

BACKGROUND AND SUMMARY OF THE INVENTION

The invention relates to a piezoelectric crystal with transversal effect. Such piezoelectric crystals have changes or reactions in different planes to applied forces. Those changes generally occur transverse to the direction of the applied force.

Piezoelectric crystals are employed in various sensors for measuring forces, pressures, accelerations, strains and moments. For this purpose, crystals with transversal effect are cut into thin plates or rods, for example. For metrological uses, these thin plates are exposed typically to a pressure on the small end surfaces of the plate, causing an electrical charge to appear on the two large side surfaces. By placing an electrically conductive layer on the two side surfaces, which however have no electrical contact with each other, this charge is measured with an appropriate device in the sensor so that information about the pressure is obtained and may be transmitted further. Such sensors are well known.

What is crucial, however, is that the crystal is fitted vertically and centered on the axis of the sensor. Any slight tilt will result in a false measurement or fracture of the crystal under the influence of the forces occurring subsequently. A contact of the crystal to the edge of the sensor may lead to a short circuit or hysteresis.

Since the sensitivity of the crystal is proportional to the ratio of the charge pickup surface to the pressure surface, these conventional crystal plates are very thin. Hence the handling, especially the centering and aligning in the sensor, are very difficult and laborious.

Often the sensor is fitted with centering aids which hold the crystal in position. However the various materials of these centering aids do not tolerate very high temperatures. Consequently the application areas of the known sensors as a whole are limited to a lower maximum temperature.

The present invention provides for a piezoelectric crystal which can be fitted easily into a sensor without laborious centering and aligning, and without restriction to a lower temperature range. Furthermore, the crystal of the present invention can be manufactured in large quantities, at low cost and fully automatically.

The present invention, then, is a piezoelectric crystal with transversal effect that has at least one plate and at least one base at an angle to the at least one plate. The at least one base projects laterally beyond a thickness of the at least one plate on at least one side of the at least one plate. An embodiment of the present invention may have two such identical crystals.

The present invention also includes a sensor for detecting one or more of force, pressure, acceleration, moments and strain signals by using at least one of the piezoelectric crystals with transversal effect discussed above.

The present invention also includes a method for producing the piezoelectric crystals with transversal effect.

Other aspects, advantages and novel features of the present invention will become apparent from the following detail description of the invention when considered in conjunction with the accompanying drawings.

BRIEF DESCRIPTION OF THE DRAWINGS

FIG. 1a is a side sectional view of a piezoelectric crystal fined in a sensor, according to the state of the art.

FIG. 1b is a plan view of FIG. 1a.

FIG. 2a is a side sectional view of a piezoelectric crystal arrangement fitted in a sensor, according to the state of the art.

FIG. 2b is a plan view of FIG. 2a.

FIG. 3 is a perspective view of an embodiment of a piezoelectric crystal, according to the present invention.

FIG. 4a is a sectional view of another embodiment of a crystal in a fitted position, according to the present invention.

FIG. 4b is a plan view and partial cross-sectional view of the fitted crystal of FIG. 4a.

DETAILED DESCRIPTION OF THE PREFERRED EMBODIMENTS

Figure 5:
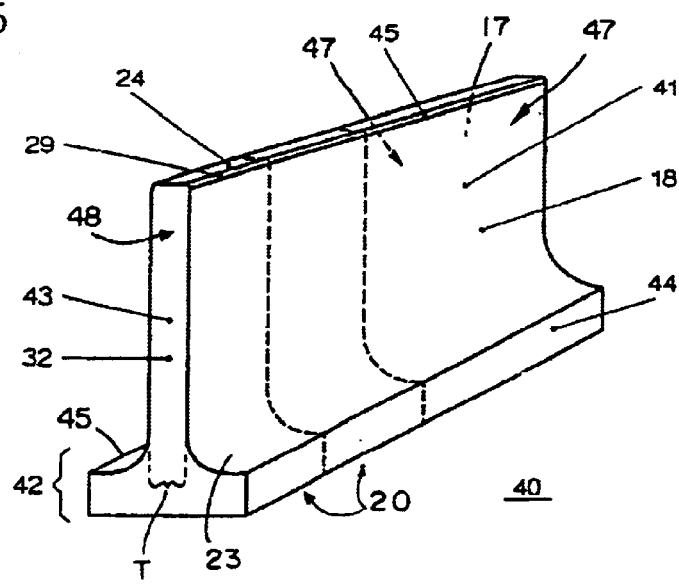
FIG. 5 is a perspective view of the production process of wafer crystals, according to the present invention.

FIGS. 1a and 1b show a piezoelectric crystal 11 with transversal effect in the form of a plate (not numbered), fitted in a sensor 10, as is known from the state of the art. The crystal 11 is clamped at its ends by holding devices 12, 1, to retain it in a required position. FIG. 1b shows the crystal 11 fitted in a sleeve 14. The electrical charges (+, −) are taken off from two side surfaces 15, 16 on electrically conductive layers or electrodes 17, 18, provided for this purpose. For example, one electrically conductive layer 17 leads to an upper holding device 12 that is negatively (−) charged, while the other conductive layer 18 leads to a lower holding device 13 on the opposite side that is positively charged (+). Accordingly, the two holding devices 12, 13 have opposite electrical charges.

FIGS. 2a and 2b show another embodiment known from the state of the art. In this embodiment, typically three identical crystal rods 11, their cross sections having the form of circular segments, are disposed in a circle as shown in FIG. 2b. The charge on the outer surface 18 of each of the crystals 11 is picked up via a sleeve 14 at or through one end of the sensor 10, for example. The other pole or polarity electrode 17 on the inside of the crystals 11 is picked up via an electrically conducting spiral 19, as shown in FIG. 2a. The spiral 19 also acts as a centering aid for the crystals 11, which in turn are held from outside on or by the sleeve 14.

FIG. 3 shows a crystal 20 with transversal effect according to the present invention. This crystal 20 comprises preferentially a monocrystalline material, whose symmetry of the piezoelectric constant d corresponds to that of the point group 32. This crystal 20 includes a base 21 which has a plate 22 attached at one end of the crystal 20. The base 21 projects laterally beyond the thickness of at least one side 15, 16 of the plate 22. The projection may be at right angles. According to the present invention, a transition surface (not identified) from an end of the plate 22 to the base 21 may have a curvature 23 to enhance the stability of the base 21 and plate 22. Other types of transition surfaces are possible. At both an end face 24 of the plate 22 opposite from the end adjacent the base 21 and on the bottom of the base 25, bevels 26 may be provided to prevent edges, sides and related surfaces of the crystal 20 from breaking.

The sides of the plate 15, 16 are each coated with an electrically conductive layer 17, 18, making a charge transport possible. One layer 17 runs on one side 15 to the top end of the crystal plate 22. The layer 18 on the opposite side 16 runs on over the edge of the base 28 to the bottom of the base 25. If the crystal 20 is clamped by suitable holding devices 12, 13 (see FIG. 4a), opposed charges can be picked up on the bottom of the base 25 and on the end face 24 of the plate 22. At the end face 24 and the base 25, it is essential that the electrically conductive layers 17, 18 are insulated electrically from each other. To ensure this, an insulating bevel 29 may be provided at the end face 24. Face 34 at the base 21 of the crystal plate 22, may be insulated by removing all or part of its conductive layer 17 such that any connection between the electrically conductive layers 17, 18 is interrupted.

FIG. 4a shows a crystal 70 fitted in a sensor 10. The bottom holding device 13 has a drilled area or recess 30 into which the base 21 can be fitted. This recess 30 must be less deep than the height of the edge of the base 28, to ensure that the side 15 having the electrically conductive layer 17 leading upwards has no electrical contact with an edge of the recess 30. Face 34 may be insulated by removing all or part of its conductive layer 17. The other side 16 having the electrically conductive layer 18 must have a good electrical contact at the bottom of the recess 30.

FIG. 4b shows a plan view and partial cross sectional view of the crystal 70 fitted into recess 30 of holding device 13. The edge of the base 28 may be circular, at least in part, and has partially rounded contours 31 formed on the base 21. This ensures that the crystal 70 fits into the recess 30 of the holding device 13 (See FIG. 4a). The curvature or contours 31 may be continuous and extend over the side faces 32 of the crystal plate 22. The curvature 31 on the base 21 should not be continuous on side 33 parallel to the crystal plate 22. Otherwise, the forming of curvature 31 would remove the electrically conductive layer 18 completely, which would have to be restored again to assure contact with the bottom surface of the base 25. By forgoing a complete curvature 31 on side of base 33, the electrically conductive layer 18 is retained and contact with the electrically conductive layer 18 of the bottom of the base 25 is assured.

A method or process for the mass production of crystals, such as crystal 20, according to the present invention, is shown in FIG. 5. A crystal wafer 40 may be in rectangular form, for example, (other geometric forms are possible). The wafer 40 may be cut in a first process stage or step so that a plate 41 of a desired thickness T is obtained, with a base ledge 42 running at least along one edge of the plate 41. Here it is essential that the transition from the plate 41 to the base ledge 42 has a curvature 23 (shown as concave) in accordance with the present invention. In a further process stage the crystal wafer 40 is coated completely with an electrically conductive layer, except for end faces 43. After this, the electrically conductive layer is broken through, preferentially at two areas. One of these areas is on or along one edge of base ledge 44 on one side of wafer 40. The other area may be provided on or along end face 24 diametrically and on the other side of the crystal wafer 40. At these areas, it is advisable to provide insulating bevels 29, 45. This results in two electrically conductive layers 17, 18 isolated electrically from each other.

In a further process step, the crystal wafer 40 (See FIG. 5) may be divided into two or more smaller crystals 20, all having a base 21 and electrically conductive layers 17, 18 (see FIG. 3). Each base 21 of crystal 20 may have at least one partially rounded contour or curvature 31 on one or more of four corners of the base 21 which may extend over the sides 32 of the plate 22 without interruption (see FIG. 3).

In a further process step, each crystal 20 may be provided with bevels 26 on the bottom edge of the base 21 and along the edge of the end face 24. However, the electrically conductive layer 17 on end face 24 must not be interrupted. The bevels 26 may be produced on the crystal wafer 40 before the electrically conductive layer is applied to the wafer 40.

The crystal 20 is inserted into the recess 30 of the holding device 13 by inserting the base 21 first. Care must be taken to ensure that the recess 30 is large enough to have some play to allow insertion of the crystal 20 without breaking. The edge of the base 28 may be about twice as high as the depth of the recess 30. The crystal 20 is not clamped in the recess 30, but is held sufficiently rigid to allow the second holding device 12 to be fitted on the opposite end of crystal 20 without the crystal 20 being able to shift off-center or tilt.

The overall height of crystal 20 may be between approximately 1 and 40 mm, and preferably between 2 and 10 mm. The height of the base 21, including the rounded contours 31 to the crystal plate 22, may be approximately $1/10^{th}$ to $1/3^{rd}$ of the overall height of the crystal 20. The crystals 20 described herein are suited for use in metrology, and in particular, for measuring forces, pressures, accelerations, moments and strains.

Figure 6:
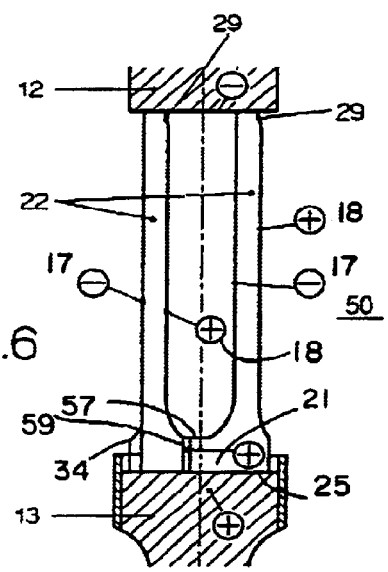
FIG. 6 is a sectional view of an embodiment of a double crystal, according to the present invention.

Another embodiment of the present invention, crystal 50, is shown in FIG. 6. This double crystal 50 may have two or more crystal plates 22, joined by a common base 21. This arrangement provides approximately a double load capacity of the crystal 50 under pressure or force, with the same sensitivity and overall height as crystal 20. This structure is formed by removing material from the center of wafer 40 (see FIG. 5) down to the base 21. Other configurations with more than two plates 22 are also possible. With this double crystal 50 configuration or similar configurations, it must be ensured that each crystal plate 22 has an electrically conductive layer 17, 18 on both sides, with the two layers 17, 18 of a plate 22 having different holding devices 12, 13, respectively, in electrically conductive contact and insulated from the other. For this, the insulating surfaces or bevels 29 must be applied. A surface or surfaces of hole 59 may be provided with an electrically conductive layer 18 in order to conduct a charge from the interior conductive layer 18 to the bottom of the base 25. Additionally, there may be other ways to electronically connect layer 18 with the bottom of base 25, such as connecting another surface (not shown) of crystal 22 to the base 25. To separate electrically charged layers 17 and 18, surface 57 may be insulated by removing all or part of its conductive layer 17 adjacent hole 59.

Figure 7:
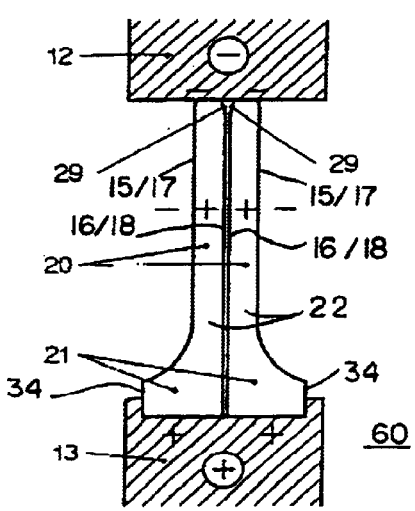
FIG. 7 is a sectional view of an embodiment of another double crystal, according to the present invention.

Another embodiment of the present invention, crystal 60, is shown in FIG. 7. This embodiment has two identical crystal plates 22, each having a base 21 projecting beyond each of the crystal plates 22 at one side of the plate 22 only. The sides 16 of the crystals 20 having no base can thus be placed adjacent to each other or together. Since sides 16 have the same polarity, short-circuiting upon contact is ruled out. The production of this crystal 60 is analogous to the production of crystals 20 from wafer 40 already described except only one face of the wafer 40 is shaped. Placing two crystals together gives a configuration 60 similar but not identical to that of one crystal 20 in FIGS. 3 and 4a. The difference is that generally, with equal geometrical conditions, the same force may be applied onto the crystal or crystals 20, but the sensitivity of the configuration with the double crystal 60 should be approximately twice as high as a configuration with the single crystal 20. That is because a surface area of the charge pickups, as shown but not identified in FIG. 7, is approximately double what is shown but not identified in FIG. 3. When the width of the crystal plates 22 is doubled, load capacity is approximately doubled for the same sensitivity. With regard to a self-centering capability, the double crystal 60 in FIG. 7 is equal to that of the single crystal 20 in FIG. 3.

In all the embodiments of the present invention, there is no need for ancillary or additional materials or aids to facilitate centering of the crystals 20, 50, 60 in a sensor 10. Consequently, the application range of the crystals 20, 50, 60 in a sensor 10 is subject to no restrictions due to temperature.

Although the present invention has been described and illustrated in detail, it is to be clearly understood that this is done by way of illustration and example only and is not to be taken by way of limitation. The spirit and scope of the present invention are to be limited only by the terms of the appended claims.

What is claimed is:

1. A piezoelectric crystal with transversal effect, comprising:
   at least one plate including at least two surfaces having an electrically conductive layer with the at least two electrically conductive layers being insulated from each other electrically;
   at least one base at an angle to the at least one plate, the at least one base projecting laterally beyond a thickness of the at least one plate on at least one side of the at least one plate; and
   wherein one of the electrically conductive layers extends onto a bottom of the at least one base and another electrically conductive layer extends onto an end face of the at least one plate opposite the bottom.

2. The crystal according to claim 1, wherein an edge of the at least one base is circular, at least in part.

3. The crystal according to claim 1, wherein there are two identical crystals each having the at least one base projecting laterally only on one side of the at least one plate and the two crystals are placed together at sides having no base projection but having the same polarity.

4. A piezoelectric sensor for detecting one or more of force, pressure, acceleration, moments and strain signals by using at least one piezoelectric crystal with transversal effect wherein the sensor comprises:
   at least one crystal having at least one plate including at least two surfaces having an electrically conductive layer with the at least two electrically conductive layers being insulated from each other electrically;
   at least one base at an angle to the at least one plate, the at least one base projecting laterally beyond a thickness of the at least one plate on at least one side of the at least one plate; and
   wherein one of the electrically conductive layers extends onto a bottom of the at least one base and another electrically conductive layer extends onto an end face of the at least one plate opposite the bottom.

5. The crystal according to claim 1, wherein the at least one plate is one plate and the at least one base is one base projecting laterally beyond the thickness of the plate on both sides of the plate.

6. The crystal according to claim 1, wherein the at least one plate is two spaced plates joined by a common base.

7. The crystal according to claim 1, wherein the angle is 90°.

8. The sensor according to claim 4, wherein the angle is 90°.

9. The crystal according to claim 6, wherein the common base has a surface between the two spaced plates with a portion of the electrically conductive layer removed.

10. The crystal according to claim 1, wherein the at least one base has one or more surfaces with at least a portion of their electrically conductive layer removed.

* * * * *